(12) United States Patent
Basore et al.

(10) Patent No.: US 7,868,248 B2
(45) Date of Patent: Jan. 11, 2011

(54) CHAIN LINK METAL INTERCONNECT STRUCTURE

(75) Inventors: Paul A. Basore, Caringbah (AU); Trevor L. Young, Botany (AU)

(73) Assignee: Pacific Solar PTY Limited, Botany, New South Wales (AU)

( * ) Notice: Subject to any disclaimer, the term of this patent is extended or adjusted under 35 U.S.C. 154(b) by 1464 days.

(21) Appl. No.: 10/487,567

(22) PCT Filed: Aug. 23, 2002

(86) PCT No.: PCT/AU02/01143

§ 371 (c)(1),
(2), (4) Date: Aug. 12, 2004

(87) PCT Pub. No.: WO03/019674

PCT Pub. Date: Mar. 6, 2003

(65) Prior Publication Data

US 2004/0261834 A1 Dec. 30, 2004

(30) Foreign Application Priority Data

Aug. 23, 2001 (AU) .................................... PR 7197

(51) Int. Cl.
*H01L 31/00* (2006.01)
(52) U.S. Cl. ........................ 136/256; 136/259; 136/244; 136/251
(58) Field of Classification Search ................. 136/256, 136/244, 251, 259
See application file for complete search history.

(56) References Cited

U.S. PATENT DOCUMENTS 4,981,525 A 1/1991 Kiyama et al.
5,421,908 A 6/1995 Yoshida et al.

FOREIGN PATENT DOCUMENTS

CA 2024662 3/1991

(Continued)

OTHER PUBLICATIONS

Japanese Office Action mailed Nov. 18, 2008 for JP Application No. 2003-523019, six pages, (English translation and Japanese language document.).

(Continued)

*Primary Examiner*—Jeffrey T Barton
(74) *Attorney, Agent, or Firm*—Morrison & Foerster LLP

(57) ABSTRACT

An interconnect structure is provided by applying a conductive layer (typically one or more metal layers 23,28) over the entire surface of the module (11) to form all of the contacts (19,32) to all of the cells in the module and then scribing the conductive layer into a series of strips using a series of straight high speed laser scribes. The strips are then divided into individual links by scribing transversely to the first scribe direction with the laser turned on and off to cut each alternate stripe. The p-type regions of the cells are contacted through holes (19), n-type regions are contacted through holes (32). A silicon film (12) is separated into cells (35a,b,c,d) by isolation grooves (16). In a first embodiment, every second transverse scribe is offset by one strip such that each strip is cut into links which overlap two links on either side that are offset by a distance equal to half the pitch of the links. The pitch of the links is equal to two cell widths and the transverse scribes are coincident with or close to interruptions in the underlying cell layout representing cell boundaries between adjacent cells of the module. In a second embodiment, conductive bridges extend across longitudinal interruptions separating the parallel extending strips. In this embodiment, the like type contact pads for the cells are aligned in rows extending transverse to the cell boundary with alternating rows of p type and n type contact pads.

33 Claims, 7 Drawing Sheets

FOREIGN PATENT DOCUMENTS

| | | |
|---|---|---|
| JP | 2-307278 A | 12/1990 |
| JP | 6-342924 A | 12/1994 |
| JP | 7-050427 A | 2/1995 |
| JP | 7-297436 A | 11/1995 |
| JP | 2-647892 B2 | 5/1997 |
| JP | 10-233517 A | 9/1998 |
| JP | 2001-156305 A | 6/2001 |
| WO | WO 83/03925 | 11/1983 |
| WO | WO 97/21253 | 6/1997 |
| WO | WO 01/33639 | 5/2001 |
| WO | WO 02/05352 | 1/2002 |

OTHER PUBLICATIONS

Supplementary European Search Report mailed on May 11, 2009, for EP Application No. 02759882.0, three pages.

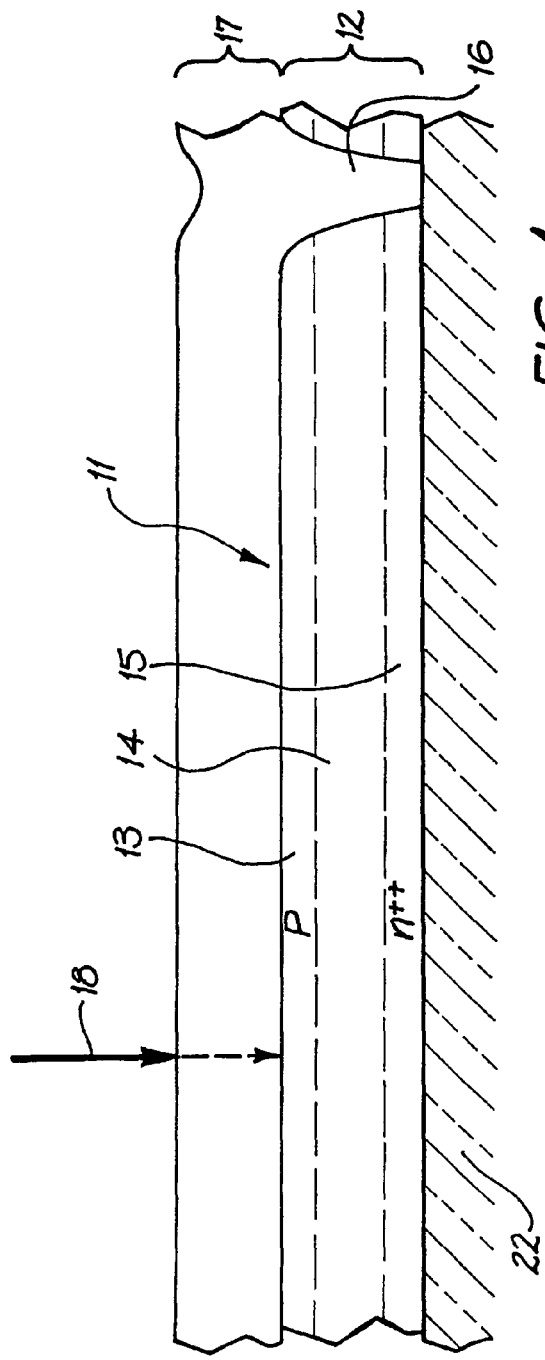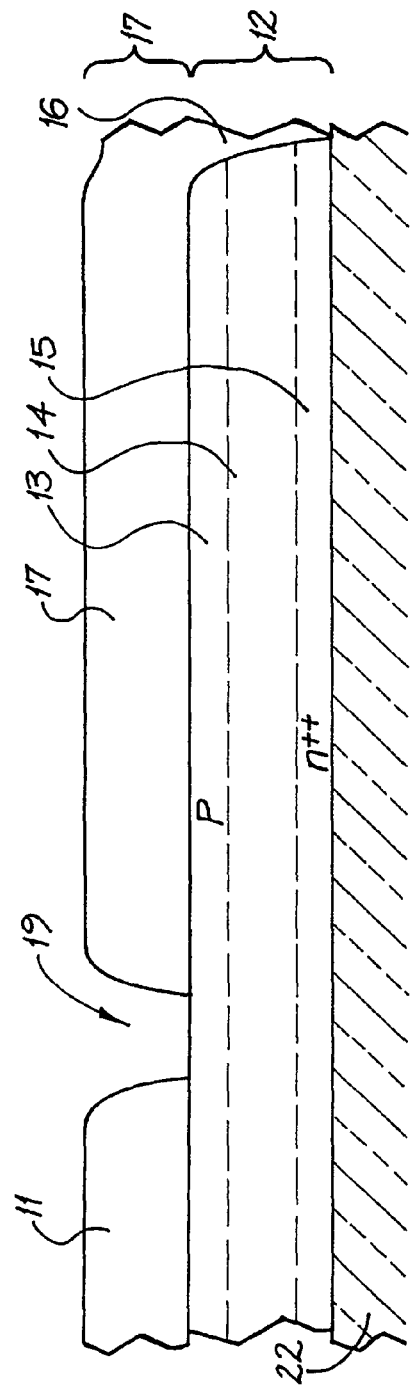

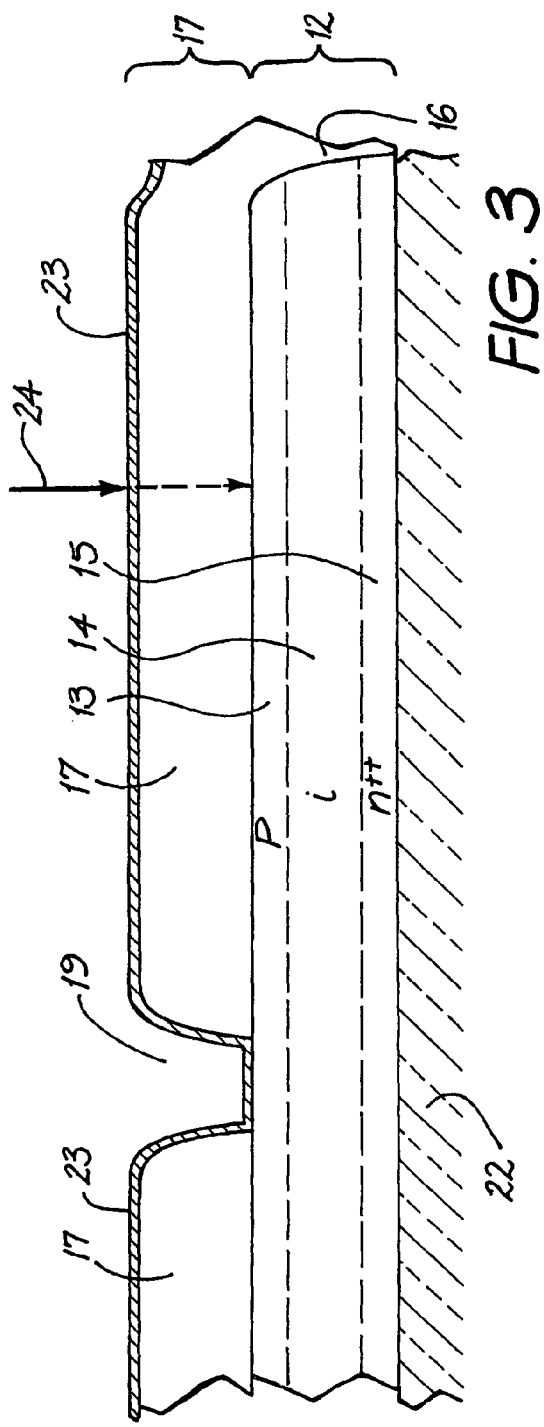
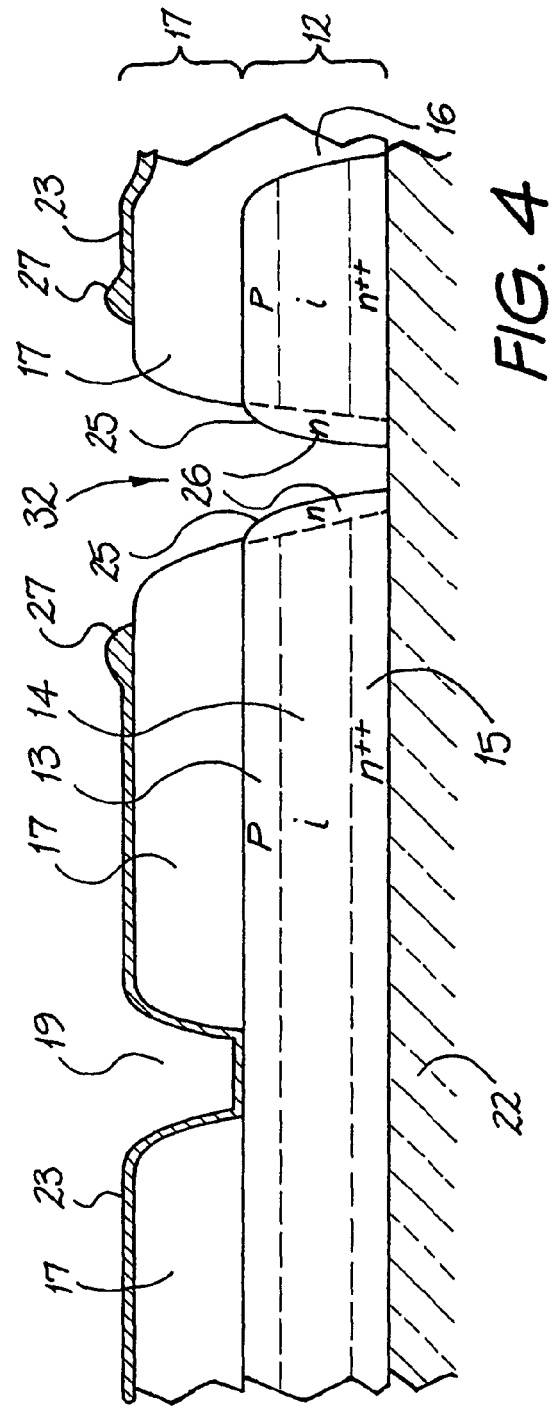

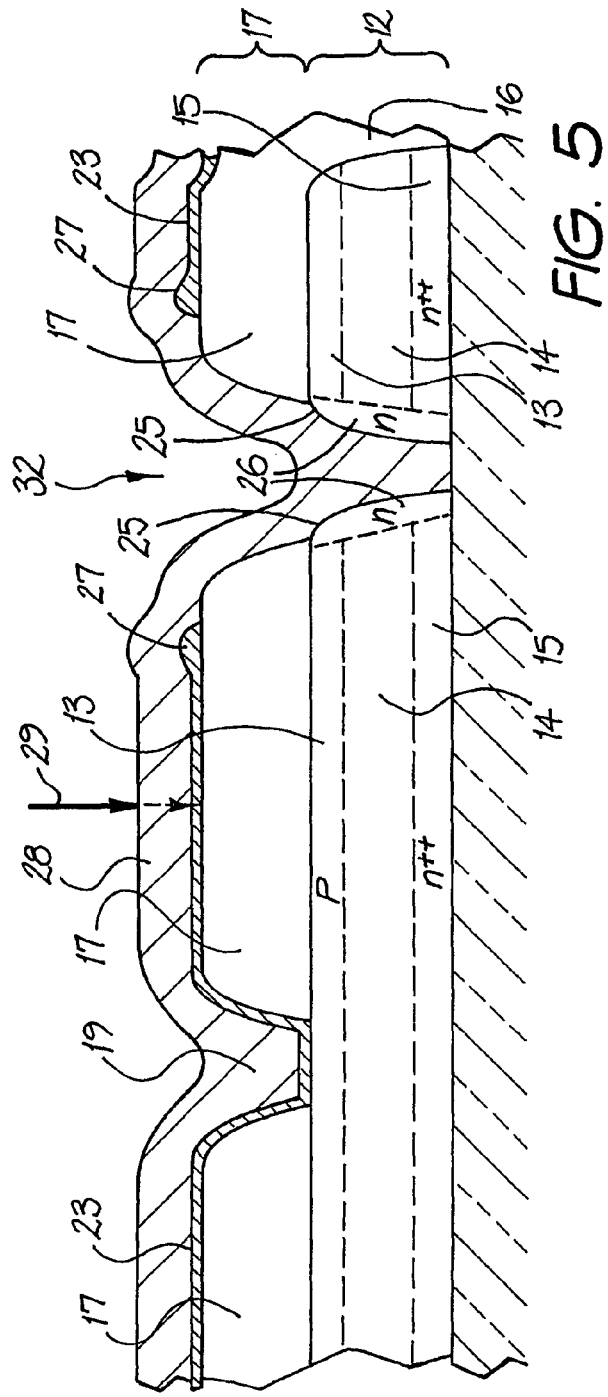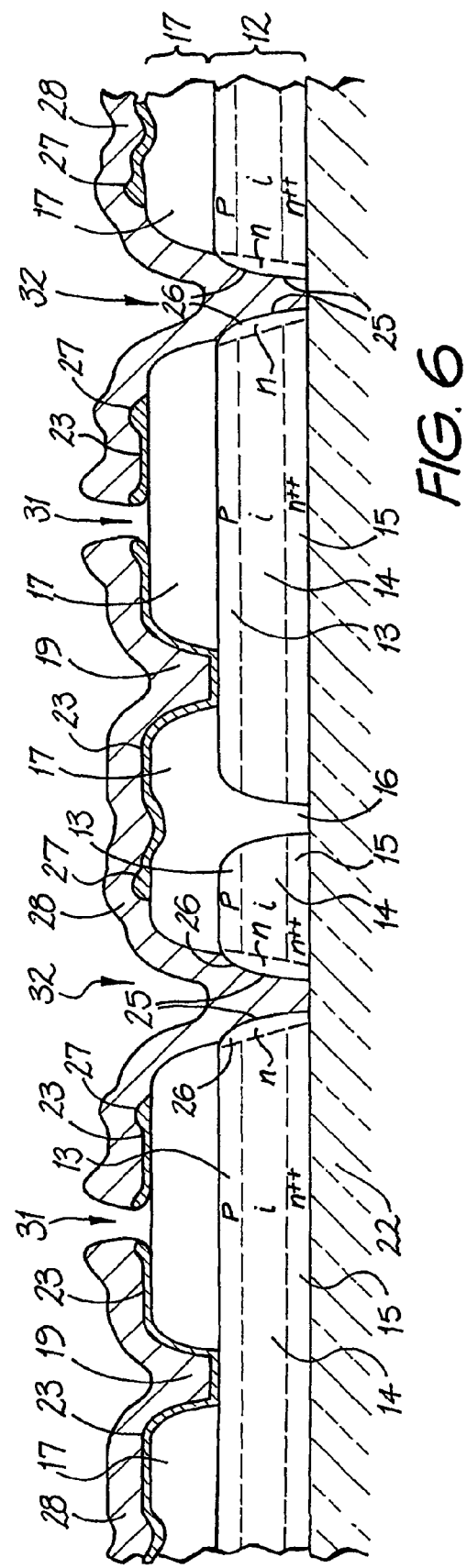

CHAIN LINK METAL INTERCONNECT STRUCTURE

The present invention relates to the manufacture of photovoltaic devices and in particular, the invention provides new interconnection arrangement for series connected cells in a multi-cell array.

BACKGROUND OF THE INVENTION

Generally, photovoltaic devices employed in electrical power generation are arranged as arrays of individual cells interconnected by conductive bands or layers (e.g. metal or Transparent Conductive Oxides etc) to produce a series parallel connected array.

Series connection of individual cells is employed to provide higher output voltages than can be achieved from a single cell, while parallel connection of cells boosts output current. The provision of both series and parallel connection of cells within a device, with relatively high levels of inter-connection between parallel paths, has the added effect of minimising degradation of the device performance due to temporary or permanent degradation of performance in an individual cell or group of cells. For example, dirt or bird droppings may reduce the current produced by cells in a small region of a device and will restrict the current flowing in all cells connected in series with those cells. However, parallel connections to other series connected cells will enable current to flow around the affected cells and minimise the effect on the total device.

It is also common practice, due to the relatively lower conductivity of semiconductor material in the body of a cell when compared to the contact material, to provide multiple contacts over a surface of individual cells to reduce series resistance in the device by reducing the distance that carriers in the semiconductor material are forced to flow laterally before reaching a contact.

Over any large area photovoltaic module, there will be shunts or short-circuits scattered about the module. Current drawn by these shunts is directly subtracted from current that could be delivered to the load. In thin film modules, the shunts typically occur at tiny bridges between metal contacts (for example due to a contaminant locally preventing the formation of a break in a metal contact layer), or due to pinholes in the insulating layers that are intended to separate the metal contact layers from the underlying semiconductor. The problem caused by shunts and localised reductions in device performance is reduced with increased levels of serial and parallel connection of cells within the module, however this also implies an increase in complexity of the metallisation patterning.

The cost of manufacturing devices with complex contact patterns is a significant factor In the overall cost of device manufacture, and is increased with Increased pattern complexity, due to the need for accurate alignment steps and in the case of laser patterning a significant reduction in speed over that possible with less complex patterns.

SUMMARY OF THE INVENTION

According to a first aspect, the present invention consists in a photovoltaic device comprising a plurality of photovoltaic cells connected in series, the interconnection of cells being made via a plurality of isolated parallel connections of a point in a p-type region of each cell to a respective point in an n-type region of another cell of the array, the isolated parallel connections all being formed using a layer of conductive material scribed to form a plurality of elongate strips, each strip being interrupted at regular intervals corresponding to cell boundaries, where the interruptions are located at or near every Nth cell boundary where N is greater than or, equal to 2 and the cell boundaries at which any one strip is interrupted are offset from the cell boundaries at which immediately adjacent strips are interrupted, such that the interruptions of every Nth strip are aligned, and each pair of cells to be connected by a particular strip are separated by N-2 cells that are not connected to the respective strip as it passes over them.

According to a second aspect, the present invention consists in a method of forming a structure of contacts over a surface of a photovoltaic device, wherein the photovoltaic device comprises at least two layered regions of semiconductor material of different dopant polarity forming a junction, and divided into a plurality of photovoltaic cells by interruptions in the semiconductor material which form cell boundaries, the contacts being located to interconnect the cells in a series connected array, the method comprising the steps of forming an insulating layer over a back surface of a semiconductor device;

forming a conductive contact layer over the insulating layer;

forming connections between the conductive layer and the p type and n type regions of the semiconductor material, either simultaneously with, or after the formation of the conductive layer;

scribing the conductive layer to produce a series of isolated conductive strips extending transversely with respect to the longitudinal direction of the cells and each conductive strip passing over pairs of cells to be connected and being connected to one contact region of each cell of each pair of cells to be connected by the respective strip, each conductive strip alternatively passing over first and second contact regions of the cells of each respective pair whereby each strip alternately makes electrical connection with the first semiconductor material layer or the second semiconductor material layer of each cell in each pair of cells which are to be interconnected by the conductive strip and each strip makes connection with semiconductor material of one dopant polarity only in each cell of the respective pair of cells; and interrupting each strip at or adjacent to every Nth cell boundary, where N is an integer greater than or equal to 2, the cell boundaries at which any one strip is interrupted being offset from the cell boundaries at which immediately adjacent strips are interrupted, such that the interruptions of every Nth strip are aligned, and each pair of cells to be connected are separated by N-2 cells that are not connected to the respective strip as it passes over them.

In the preferred embodiment N equals 2 and there are no intervening cells separating the connected cells.

According to a third aspect, the present invention consists in a photovoltaic device comprising a plurality of parallel-extending, elongate, photovoltaic cells connected in series, the series connection of each cell with its adjacent cells being made via a plurality of isolated parallel connections of points in a p-type region of each cell to a respective plurality of points in an n-type region of an adjacent cell of the array, the isolated parallel connections all being formed using a layer of conductive material scribed to form a plurality of elongate strips extending transversely relative to cell boundaries which separate the parallel extending cells, each strip being interrupted at or adjacent every second cell boundary and adjacent strips being interrupted at alternate cell boundaries.

According to a fourth aspect, the present invention consists in a photovoltaic device comprising a plurality of parallel extending elongate photovoltaic cells, wherein a plurality of first conductive contacts connect a p-type region of each cell to an n-type region of a cell adjacent one side of the respective cell and a plurality of second conductive contacts connect an n-type region of each cell to a p-type region of a cell adjacent a side opposite said one side of the respective cell, the first and second conductive contacts all being formed using a layer of conductive material scribed to form a plurality of elongate strips extending transversely relative to cell boundaries which separate the parallel extending cells, each strip being interrupted at or adjacent every second cell boundary and adjacent strips being interrupted at alternate cell boundaries.

According to a fifth aspect, the present invention consists in a method of forming a structure of contacts over a surface of a photovoltaic device, wherein the photovoltaic device comprises at least two layered regions of semiconductor material of different dopant polarity forming a junction, and divided into a plurality of parallel-extending, elongate, photovoltaic cells by parallel interruptions which form cell boundaries in the semiconductor material, the contacts being located to interconnect the cells in a series connected array, the method comprising the steps of:

forming an insulating layer over a back surface of a semiconductor device;

forming a conductive contact layer over the insulating layer;

forming connections between the conductive layer and the p type and n type regions of the semiconductor material, either simultaneously with, or after the formation of the conductive layer;

scribing the conducting layer to produce a series of isolated conductive strips each passing over one contact region of each cell of a series of cells, each conductive strip alternatively passing over first and second contact regions of the cells of the respective series whereby the respective strips alternately make electrical connection with the first semiconductor material layer or the second semiconductor material layer of each cell and each strip makes connection with semiconductor material of one dopant polarity only in each cell of the respective series of cells; and interrupting each strip at or adjacent to every second cell boundary with adjacent strips interrupted at alternate cell boundaries.

According to a sixth aspect, the present invention consists in a method of forming a structure of contacts over a surface of a photovoltaic device, wherein the photovoltaic device comprises at least two layered regions of semiconductor material of different dopant polarity forming a junction, and divided into a plurality of parallel-extending, elongate, photovoltaic cells by parallel interruptions which form cell boundaries in the semiconductor material, the contacts being located to interconnect the cells in a series connected array, the method comprising the steps of:

forming an insulating layer over a back surface of a semiconductor device;

forming first openings through the insulating layer to expose an active surface of a first overlying layer of semiconductor material of a first dopant polarity, in a first contact region of each cell;

forming a first conducting contact layer over the insulating layer and extending into the first openings to form electrical connections with the back surface of the first overlying layer of semiconductor material;

forming second openings through the first conductive contact layer and the insulating layer where connections are to be made to an underlying second layer of semiconductor material of a second dopant polarity in at least one location in a second contact region of each cell;

creating a conduction path to the underlying second layer of semiconductor material of a second dopant polarity under each of the second openings, the conduction path extending between the underlying second layer of semiconductor material and the back surface under the insulating layer at the respective second opening;

forming a second conductive contact layer over the first conductive layer, the second conductive layer extending into the second openings and forming electrical connection with the second layer of semiconductor material through the second openings;

scribing the conducting layer to produce a series of isolated conductive strips each passing over one contact region of each cell of a series of cells, each conductive strip alternatively passing over first and second contact regions of the cells of the respective series whereby the respective strips alternately make electrical connection with the bridging region or the second semiconductor material layer of each cell and each strip makes connection with semiconductor material of one dopant polarity only in each cell of the respective series of cells; and interrupting each strip at or adjacent to every second cell boundary with adjacent strips interrupted at alternate cell boundaries.

Preferably the second openings extend to the underlying second layer of semiconductor material. The conduction path to the underlying second layer of semiconductor material may be formed by altering the characteristics of the material around and beneath the second openings or as a result of the process of forming a conductive contact layer extending into the second opening, or a combination of the two.

In the preferred embodiment, the photovoltaic device is a polycrystalline thin film silicon solar cell comprising a textured glass substrate over which is formed an anti-reflection coating and a film of silicon having at least two oppositely doped regions forming a junction in a plane parallel to the surface of the film.

The insulating layer formed over the silicon film may be a single layer but is preferably a plurality of layers including a thin passivation layer and a thicker layer of a different dielectric material. Preferably, the passivation layer will be a layer of silicon nitride or silicon oxide of between 50 and 200 nm and preferably about 100 nm. The thicker dielectric layer is preferably a layer of organic resin such as novolac with a thickness of between 2-5 μm and preferably about 3-4 μm.

The conductive layer which forms the contacts, may be a single layer of metal such as aluminium or may be formed as a plurality of layers including a thin layer of nickel, silver or copper with a thickness in the range of 5-20 nm and preferably about 10 nm and an aluminium layer over the copper, silver or nickel with a thickness in the range of 50-150 nm and preferably about 90-110 nm. Other possible contact materials include heavily doped semiconductor material and conducting polymers.

For thin film embodiments having dimensions as set out above, the holes formed in the Insulating layer through which the p type contacts are made, will have diameters in the range of 50-500 μm and preferably about 140-160 μm. The holes for the n type contacts will have diameters in the range of 25-100 μm and preferably about 35-45 μm. The contact holes will preferably be circular and in the case of the n type holes, will be spaced apart to prevent isolation of parts of the cell area. However, elongate holes may also be used in some embodiments. The holes may be formed by laser, in which case the shape is dependent on the shape of the laser beam used to form the holes.

Scribing of the metal is preferably performed by laser and is performed at a rate that allows overlapping laser pulses to completely remove the metal layer while not significantly removing underlying insulating material. For high powered lasers this may require defocusing of the laser and will result in wider scribes. Embodiments of the present invention have been found to be effective with scribe widths of 100-200 μm and preferably about 140-160 μm.

It will be recognised that the dimensions given are suitable for cells of the type described In the preferred embodiment. For other cell types, or thin film cells having significantly different film thickness, the dimensions of the insulating and metal layers and the widths of the contact holes and laser scribes will change to suit the circumstances of the particular environment.

In a seventh aspect, the invention consists in a photovoltaic device comprising a plurality of parallel extending, elongate photovoltaic cells connected in series, the interconnection of cells being made via a plurality of isolated connections of a point in a p-type region of each cell to a respective point in an n-type region of another cell of the array, the isolated connections all being formed using a layer of conductive material scribed to form a plurality of elongate strips extending transversely relative to cell boundaries, the scribes defining interruptions which separate the parallel extending strips, each strip also being interrupted at regular intervals corresponding to or adjacent to cell boundaries wherein conductive contacts extend across the interruptions separating the parallel extending strips, to define the isolated connections.

The strips may be aligned in rows defining like contacts wherein the rows alternately define p type and n type contacts.

The strips defining p type contacts may be of a different width as measured in the direction of the cell boundaries to those strips defining n type contacts.

In one variant, the isolated connections are formed by periodically switching off the laser during a horizontal scribe.

Alternatively, the isolated connections are formed by defining an elongate through opening in the insulating layer which extends across a line where a horizontal scribe is to be defined which is subsequently coated or part-filled with the layer of conductive material during a process of making the device which conductive material remains un-ablated during the passage of the scribing laser over the through opening due to conduction of the heat generated by the laser to the underlying silicon.

The elongate hole may comprise a series of overlapping, generally circular, holes, In an eighth aspect, the invention consists in a method of forming a structure of contacts over a surface of a photovoltaic device, wherein the photovoltaic device comprises at least two layered regions of semiconductor material of different dopant polarity forming a junction, and divided into a plurality of photovoltaic cells by interruptions in the semiconductor material which form cell boundaries, the contacts being located to interconnect the cells in a series connected array, the method comprising the steps of:

forming an insulating layer over a back surface of a semiconductor device;

forming a conductive contact layer over the insulating layer;

forming connections between the conductive layer and the p type and n type regions of the semiconductor material, either simultaneously with, or after the formation of the conductive layer;

scribing the conductive layer to produce a series of conductive strips extending transversely with respect to the longitudinal direction of the cells;

wherein the scribing process is arranged to leave a conductive bridge extending across the transverse scribe connecting a point in a p type region of one cell to a point in an n type region of another cell.

The step of scribing the conductive layer may be carried out by a laser ablating areas of the layer of conductive material.

The isolated connections may be formed by periodically switching off the laser during a scribe to leave an un-ablated conductive area.

In a ninth aspect, the Invention consists in a method of forming a structure of contacts over a surface of a photovoltaic device, wherein the photovoltaic device comprises at least two layered regions of semiconductor material of different dopant polarity forming a junction, and divided into a plurality of parallel-extending, elongate, photovoltaic cells by parallel interruptions which form cell boundaries in the semiconductor material, the contacts being located to interconnect the cells in a series connected array, the method comprising the steps of:

forming an insulating layer over a back surface of a semiconductor device;

forming a conductive contact layer over the insulating layer;

forming connections between the conductive layer and the p type and n type regions of the semiconductor material, either simultaneously with, or after the formation of the conductive layer;

scribing the conducting layer to produce a series of conductive strips each passing over one contact region of each cell of a series of cells each conductive strip being connected by a bridge extending across an interruption whereby each strip makes connection with semiconductor material of one dopant polarity only in each cell of the respective series of cells; and interrupting each strip at or adjacent to every cell boundary.

Typically, the step of scribing the conducting layers is carried out using a laser ablating areas of the layer of conductive material.

In one version, the bridges are formed by periodically switching off the laser during a horizontal scribe.

Alternatively, the isolated connections are formed by defining an elongate through opening in the insulating layer which extends across a line where a horizontal scribe is to be defined and which is subsequently coated or part-filled with the layer of conductive material, which conductive material remains un-ablated during the passage of the scribing laser over the through opening due to conduction of the heat generated by the laser to the underlying silicon.

The step of forming the elongate hole may include forming a series of overlapping generally circular holes.

Any discussion of documents, acts, materials, devices, articles or the like which has been included in the present specification is solely for the purpose of providing a context for the present invention. It is not to be taken as an admission that any or all of these matters form part of the prior art base or were common general knowledge In the field relevant to the present invention as it existed in Australia before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF THE DRAWINGS

Embodiments of the invention will now be described by way of example with reference to the accompanying drawings in which:

FIG. 1 is a sectional view through a semiconductor device after a first step of a first embodiment, the method of the present invention has been applied;

FIG. 2 is a sectional view through a semiconductor device after a first opening step of the invention has been applied according to the first embodiment;

FIG. 3 is a sectional view through a semiconductor device after a first metallisation step of the invention has been applied according to the first embodiment;

FIG. 4 is a sectional view through a semiconductor device after a second opening step of the invention has been applied according to the first embodiment;

FIG. 5 is a sectional view through a semiconductor device after a second metallisation step of the invention has been applied according to the is first embodiment;

FIG. 6 is a sectional view through a semiconductor device after the metallisation formed in accordance with the first embodiment has been interrupted to separate the contacts to the p & n type regions;

DETAILED DESCRIPTION OF EMBODIMENTS OF THE INVENTION

Figure 7:
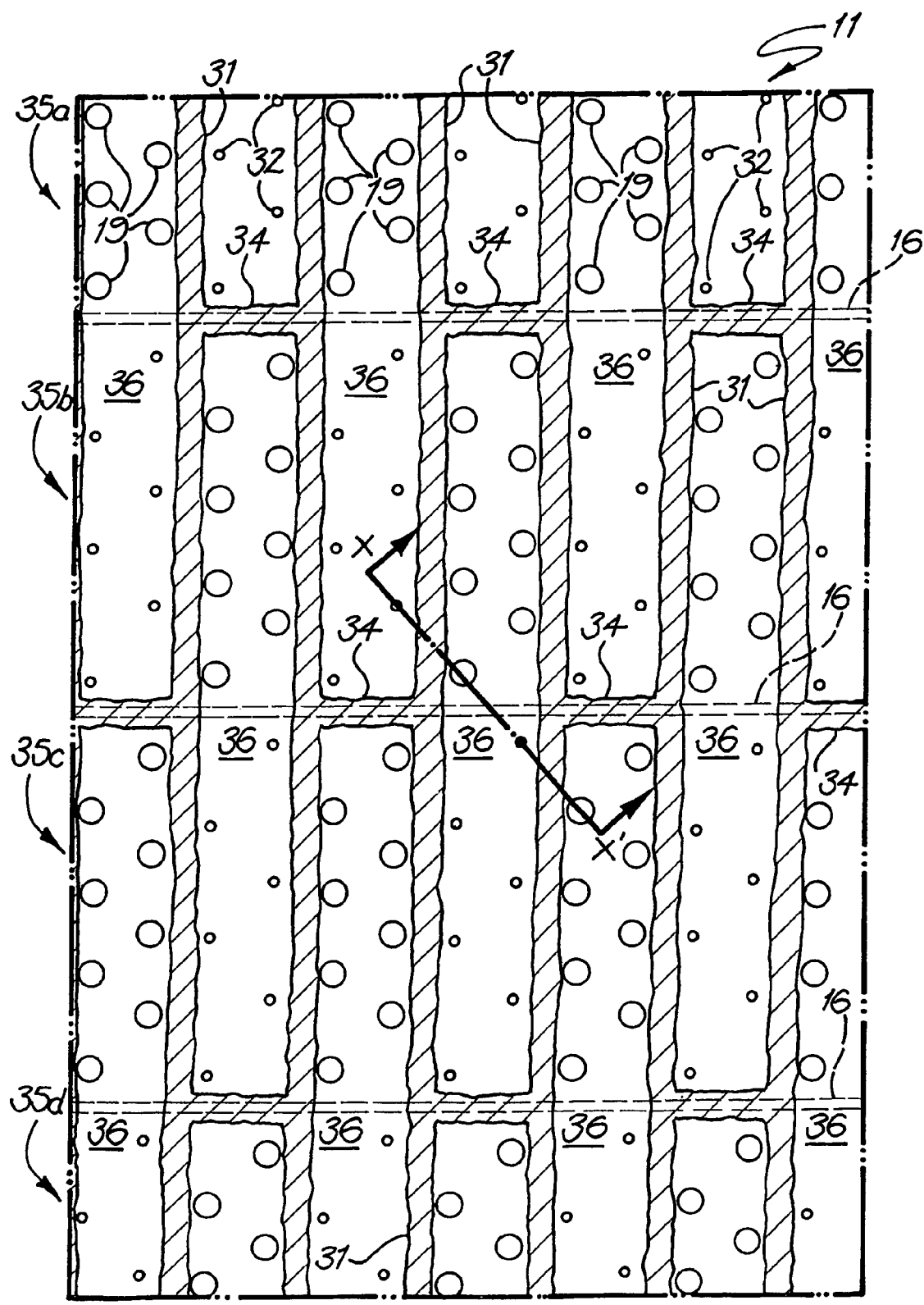
FIG. 7 is a back view of part of the device of FIGS. 1 to 4 after metallisation and patterning of the metal layer.

A detailed description of one embodiment of the invention will now be provided in the context of a particular large area thin film silicon photovoltaic device, however the invention generally provides a distributed (as opposed to consolidated) connection between cells which is relatively low-cost and is applicable to a variety of cell and contact technologies.

As previously stated, over the extent of a large area photovoltaic module, there will generally be a number of shunts or short-circuits scattered about the module, which draw current that could otherwise be delivered to the load. The effects of shunts and localised reductions in device performance on overall module performance are generally reduced with increased levels of serial and parallel connection of cells within the module, however this also implies an increase in complexity of the metallisation patterning.

Typically an intricate interconnect structure is expensive to create. However the interconnect structure described below has the added advantage that It can be created using a small number of steps and at relatively high speed thereby keeping the expense down compared to other designs and technologies.

The interconnect structure is produced by applying a conductive layer (typically one or more metal layers), over the entire surface of the module to form all of the contacts to all of the cells in the module and then scribing the conductive layer into a series of strips using a series of straight high speed is laser scribes. The strips are then divided into individual links by scribing transversely to the first scribe direction with the laser turned on and off to cut each alternate strip, with every second transverse scribe offset by one strip such that each strip is cut into links which overlap two links on either side that are offset by half the pitch of the links. The pitch of the links is equal to two cell widths and the transverse scribes are coincident with or close to interruptions in the underlying cell layout representing cell boundaries between adjacent cells of the module. This contact structure and the method of its manufacturing will now be described in the context of a particular large area thin film silicon photovoltaic device however the process can be modified, for example by changing the number of offsets employed and the number of other cells to which each cell is connected. It is also not essential for the cells to extend the width of a module as is the case in the described example and so the invention may be applicable to a variety of module and cell structures and layouts.

In the case of the cell structure described below, parallel connection is provided by constructing long cells such that they approximate a plurality of parallel connected cells, however because the parallel connection is through the semiconductor rather then through metal, series resistance will prevent localised short circuits from bypassing the whole cell. Therefore by providing a plurality of series connections between each pair of adjacent cells this advantage of the long cell may be exploited, such that localised faults are self isolating and self bypassing.

Referring to the drawings, FIG. 1 illustrates a part of a semiconductor device structure 11, which is a precursor to a device fabrication process Into which the method of the present invention has been integrated. In FIG. 1 a first step of the fabrication process has been applied. The semiconductor device Is a photovoltaic module comprising a thin polycrystalline silicon film 12 formed on a glass substrate 22 covered with a thin anti-reflection coating and having an upper p-type region 13, a lower $n^{++}$ type region 15 and an intrinsic or lightly doped region 14 separating the p and n-type regions. The silicon film 12 is separated into cells by scribed isolation grooves 16. The glass surface is preferably textured to promote light trapping, but this is not shown in the figures for sake of clarity. Typically, the surface texturing of the glass will have dimensions up to 0.2 to 0.7 μm and the anti-reflection coating will be a silicon nitride coating of in the order of 70 nm. The silicon film will typically be in the range of 0.5 to 110 μm thick and preferably between 1 and 3 μm, with the p and n type doped regions each having a heavily doped region extending for a depth of about 0.1 μm. Texturing of the glass surface may be achieved by applying a coating of texturing material or by directly texturing the glass e.g. by etching.

The first step of the device fabrication method is the formation of an insulating layer 17 over the thin silicon film 12. Preferably, the insulating layer is a two layer film composed of a thin (50-200 nm and preferably about 100 nm) layer of silicon nitride or silicon oxide plus an organic resin known as novolac, which is formed to a thickness in the order of 2-5 μm and typically 3-4 μm.

A first set of holes 19 (ref FIG. 2) is then formed in the insulating layer 17 by heating the regions to be opened with a laser 18. The laser locally heats the underlying silicon which causes the novolac to erupt leaving a hole 19 exposing the silicon beneath. Heat treatment can be used subsequently to smooth the edge of the insulating layer surrounding the hole if necessary. After heat treatment of the novolac, the silicon nitride or silicon oxide exposed by the removal of the novolac is removed by a chemical etch to expose the surface of the semiconductor material beneath. This set of holes is provided to allow contact to the back surface of the semiconductor material 12 to thereby enable a connection to be made to the p type region 13 of the device and therefore the holes are opened with minimal heating of the semiconductor material in order to minimise the amount of disruption of the p and n type semiconductor material in the vicinity of the holes. This is achieved by defocusing the laser beam and results in larger openings in the insulating layer then would occur with a more tightly focussed laser. The shape and dimension of the holes are determined by the cross sectional shape of the laser beam, but will typically be approximately circular non-overlapping and having a diameter in the range of 50-500 μm and preferably about 150 μm.

Turning to FIG. 3, a thin metal layer 23 is then deposited over the insulating layer 17 and extends into the holes 19 to contact with the p-type region 13. The thin metal layer 23 is preferably of nickel or copper and Is typically in the order of 10 nm, serving both as the contact to the p-type region 13 and as a back reflector. Copper is a superior optical reflector to nickel and each of the metals make reliable contacts with p-type silicon. However, nickel does not adhere to novolac as strongly as does copper, a fact which assists in subsequent formation of metal isolation grooves.

When nickel is used, the thickness can be decreased to less that 10 nm so that the layer becomes nearly transparent to light, in which case it does not interfere with optical reflection from subsequent layers.

A second thin layer of silver can be added to increase the optical reflectance; however, silver cannot be used alone as it makes poor electrical contact to silicon.

A laser 24 (ref. FIG. 3) is employed to open holes through the thin metal layer 23, insulating layer 17, and semiconductor layers 13, 14, 15 to form an opening 32, as is illustrated in FIG. 4, extending through the silicon film 12 to the glass substrate 22.

When the opening 32 is formed, the very thin metal layer 23 in the vicinity of the opening is caused to evaporate from the area surrounding the opening 32 and the remaining molten metal shrinks back to form a thickened portion 27 such that the opening in the metal layer 23 is 2-3 times the diameter of the openings in the silicon.

The openings 32 are again either elongate grooves or spaced holes so that lateral continuity is maintained in the semiconductor layer. As for the first set of holes 19, the shape and dimension of the holes 32 are determined by the cross sectional shape of the laser beam, which in the case of the second set of holes 32 is more tightly focussed than In the case of the first set of holes 19, and will typically be approximately circular non-overlapping and having a diameter in the range of 25-100 μm and preferably about 40 μm.

As also illustrated in FIG. 4, the silicon surfaces 25 exposed by the opening 32, are doped with n-type dopant, which isolates the opening 32 from the p-type region 13 and provides a surface for formation of the n-type contact.

Referring to FIG. 5, the n-type contact is formed by a second thin metal layer 28 formed over the first thin metal layer 23, the second metal layer 28 extending into the opening 32 and contacting the surfaces 25 of the opening 32. Preferably the conductive layer 28 will be a layer of metal such as aluminium, however the conductive layer might also include related alloys, a layer of heavily doped semiconductor material, a layer of conductive plastics material or other suitable conductor, When contacts are formed of aluminium over a previously formed first metal layer of nickel, the nickel and aluminium layers are preferably in the order of 10 nm and 100 nm respectively. The metal layers are preferably applied by sputtering.

The final step in the process is the isolation of the n-type and p-type contacts which is achieved by using a laser 29 to melt and/or evaporate the metal layers 23 and 28 to thereby form an isolation groove 31 as seen In FIG. 6.

A portion of the completed structure is illustrated in FIG. 6 which shows the connection of an n-type contact of one cell to the p-type contact of an adjacent cell to provide a series connections of cells. The section shown in FIG. 6 approximates the section that would be seen through section line X-X' shown in FIG. 7.

When the laser is pulsed on, a small amount of metal is ablated directly under the beam and surface tension in the surface of molten metal surrounding the ablated region pulls the metal back from the hole causing a slight thickening of the metal around the hole, and creates an opening 31 (ref FIG. 6). The opening 31, as seen in elevation in FIG. 6, represents one point in a scribe illustrated in plan view in FIG. 7, which is significantly larger in diameter than the original ablated region. Because the adhesion of the nickel layer 23 to the underlying dielectric which is in this case, an organic resin known as novolac, is not as great as is the case for aluminium, the combined aluminium and nickel layer 23, 28 peels back more readily than would be the case if aluminium alone were used. By pulsing the laser on centres spaced at a regular pitch less than the beam diameter, a series of joined holes, surrounded by a pair of metal mounds, are formed to provide a continuous gap separating two regions of the metal film that are to be electrically isolated from one another (see FIG. 7). Typically, the isolation scribes will be from 100-200 μm wide and preferably about 150 μm wide. The scribes are typically spaced on centres of 0.2-2.0 mm and preferably about 1 mm to form conducting strips about 0.2-1.9 mm and preferably about 0.85 mm wide.

Referring to FIG. 7, the isolation scribe comprises a first set of long scribes 31 transverse to the cells 35 and having dimensions as described above, and a second set of short scribes 34 between the long scribes 31 over cell boundaries 16 to separate the strips formed by the long scribes 33 into shorter links 36. The shorter scribes 34 have a similar width to the long scribes 33 but are separated by two cell widths to allow cell interconnection.

FIG. 7 illustrates a rear view of a part of a device incorporating a contact structure according to an embodiment of the invention, from which it will be seen that each of the cells of the device 11 comprises an elongate photovoltaic element 35a, 35b, 35c, 35d divided across its long axis by a plurality of transverse scribes 33 which isolate alternate sets of holes 19 and holes 32 respectively providing contacts to the p-type and n-type regions of the cell. The transverse scribes 31 are made as long substantially straight scribes extending over the length of the device such that each scribe crosses each elongate cell. By using long continuous scribes in this manner, the scribes may be made at the maximum translation rate of the laser table that will allow overlapping laser shots (assuming that the laser can fully remove the metal under the beam in one shot). This method of operation of the laser is much faster than when trying to scribe patterns with corners where the laser has to be stopped and started at precise locations.

Following the formation of the first set of scribes 31, a further set of cell isolation scribes 34 are formed over the cell separation scribes 16 between adjacent cells 11, to isolate every second pair of cells. The cell isolation scribes 34 extending to either side of any one of the elongate transverse scribes 31 are offset by one cell with respect to those on the other side of the same transverse scribe 31 such that the cells become series connected by a matrix of connection links 36 with alternating offsets, connecting one set of p-type contacts 19 of one cell 35 to a set of n-type contacts 32 of an adjacent cell 35, as shown in FIG. 7.

Figure 8:
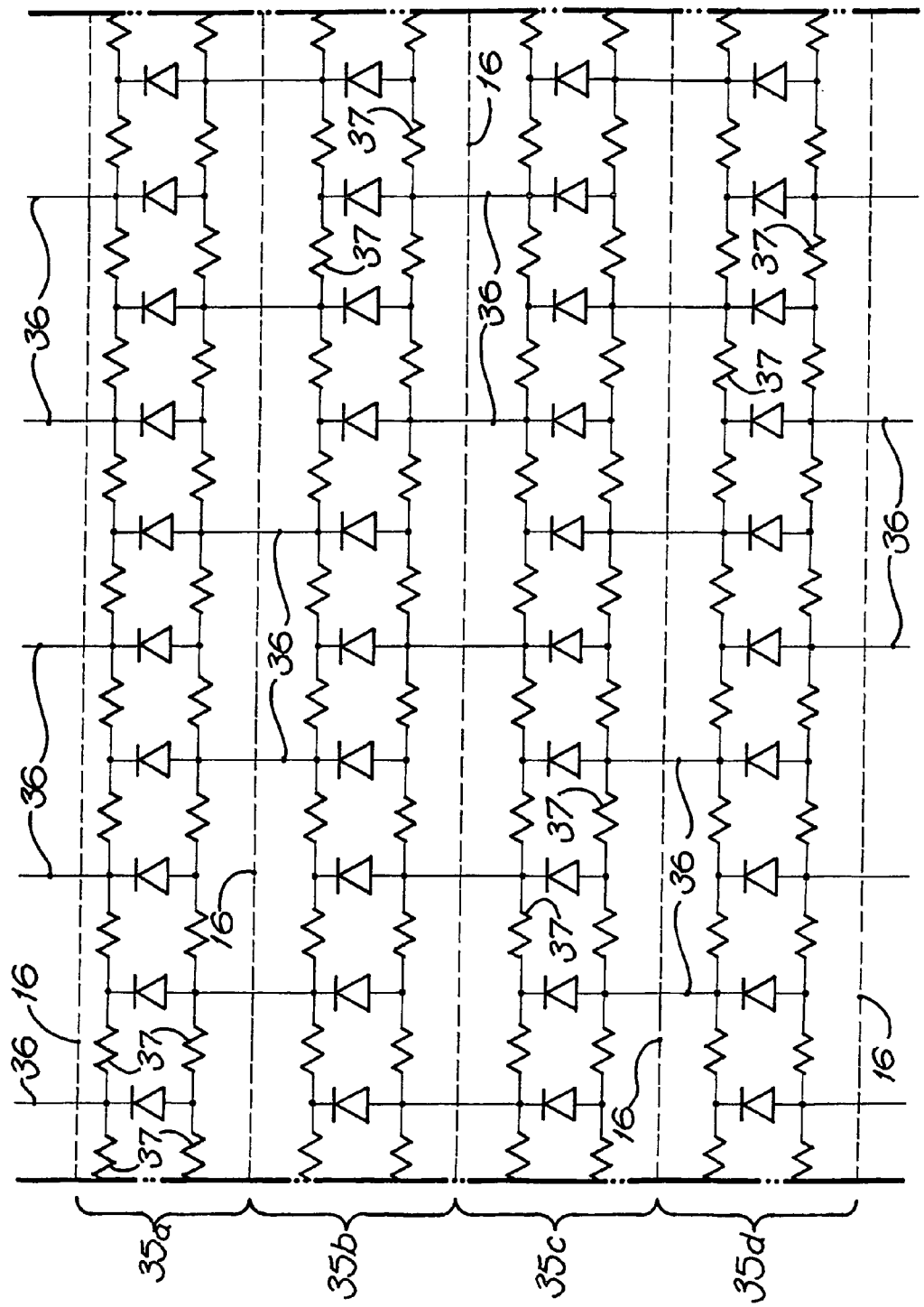
FIG. 8 is a schematic diagram of an equivalent circuit of a part of a device made in accordance with an embodiment of the present invention.

An equivalent circuit for a part of the device of FIG. 7 is illustrated in FIG. 8, from which it will be seen that the links 36 provide a plurality of connections between the anode of one elongate cell 35 (represented as a plurality of parallel connected diodes) and the cathode of an adjacent cell. The lateral resistance of the cells is indicated by a plurality of resistors 37 which limit lateral current in the cell between the series links 36 and cause the effect of a shunt to be contained to the region immediately surrounding the shunt. This configuration allows higher voltages to be achieved by way of series connection while allowing current to flow around bad or shaded areas of the device.

Figure 9:
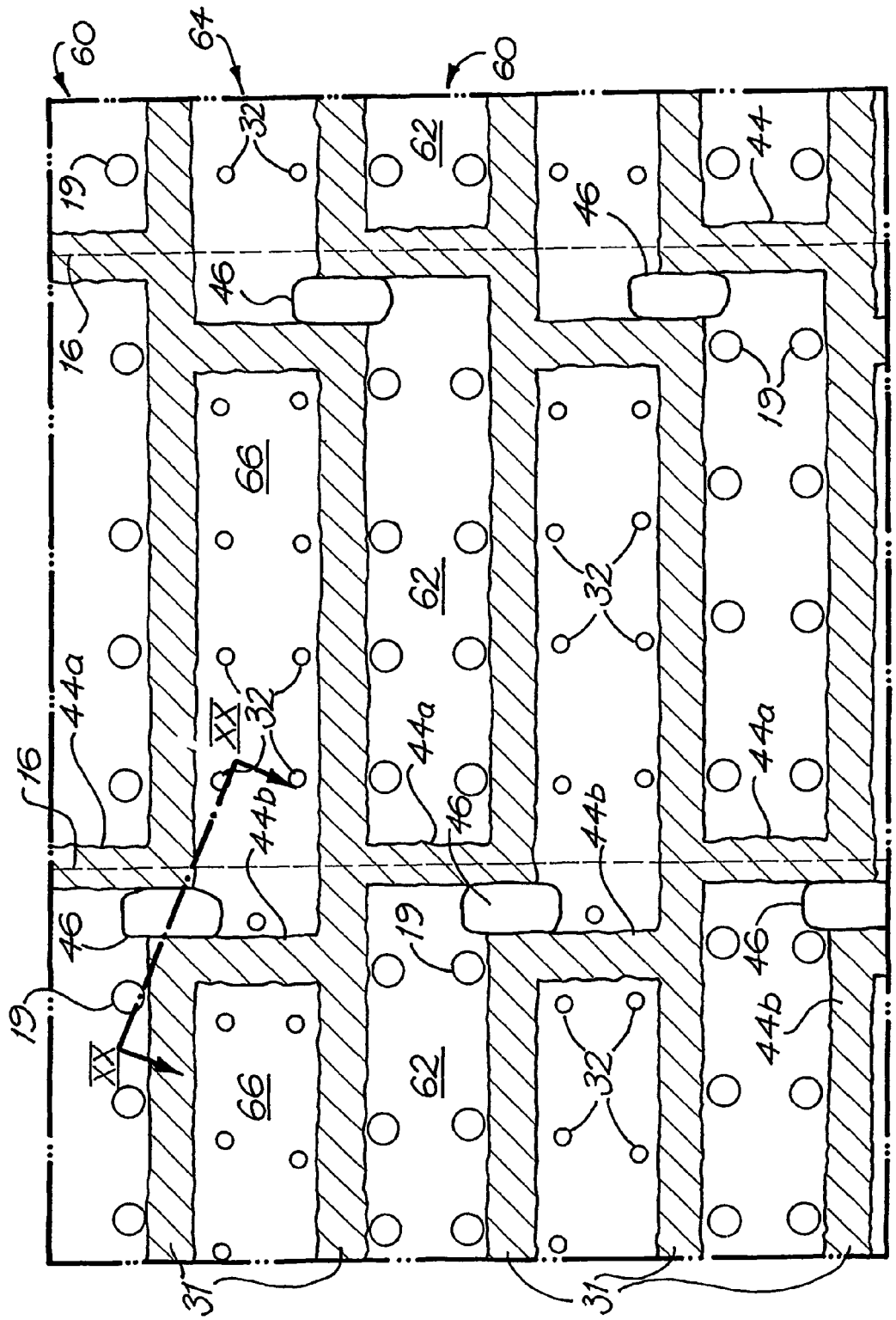
FIG. 9 is a back view of a second embodiment of a semiconductor device.

FIG. 9 illustrates a rear view of a part of a device incorporating a contact structure according to a second embodiment of the invention which is a variation on the contact structure of the first embodiment and made by a process which is a variant of that described above. In this second embodiment as can be seen in the figure, the like type contacts in adjacent cells are aligned in the transverse direction. Thus as shown in FIG. 9, there is a transverse strip 60 of generally rectangular metal pads 62 defining p type contacts, above which is a further strip 64 of metal pads 66 defining n type contacts 32 above which is a further strip of metal pads 62 defining p type contacts, and so on.

In the second embodiment, the manufacturing process is largely similar to that of the first embodiment except for the arrangement of contacts for the cells on the device as discussed above, and the method of formation of connections between cells.

As with the first embodiment, the isolation scribe comprises a first set of long scribes 31 transverse to the cells 35 from 100-200 µm wide, preferably about 150 µm wide.

A second set of short (isolation) scribes 44 extend between the long scribes near the cell boundaries 16. In contrast with the first embodiment, every horizontal strip 60, 64 is mechanically interrupted by a vertical scribe 44 at or adjacent every cell boundary 16. The scribed areas are illustrated with cross-hatching.

Referring again to FIG. 9, it can be seen that the scribes 44 are staggered with every second cell isolation scribe 44a aligned with a cell boundary 16 and the other cell isolation scribes 44b spaced to one side of the cell boundary by a distance of 100-500 µm and preferably about 250 µm.

Metal bridges 46 connect the p type metal contact pads 19 of one cell to the n type metal contact pads 32 of an adjacent cell, The bridges 46 are formed by a similar process that is used to make the p type contacts 19 as described with reference to FIG. 2. In particular a line of overlapping holes is formed in the insulating layer using the laser 18 to locally heat the underlying silicon which causes the novolac to erupt leaving a hole 19 exposing the silicon beneath. The line of holes is intentionally positioned to span the line of the transverse scribes 31. The line is subsequently coated/part-filled with the metal layers 23 and 28 during the later stages of the manufacturing process in the same way that the p type contacts are coated. When the laser which forms the horizontal scribe 31 passes over the line of holes, it is unable to remove the metal therefrom since the metal is in direct contact with silicon 13, which acts as a relatively good heat sink and, in contrast with the novolac which is a relative thermal insulator, compared to the silicon, conducts the heat of the laser away preventing the bridge from ablating.

Figure 10:
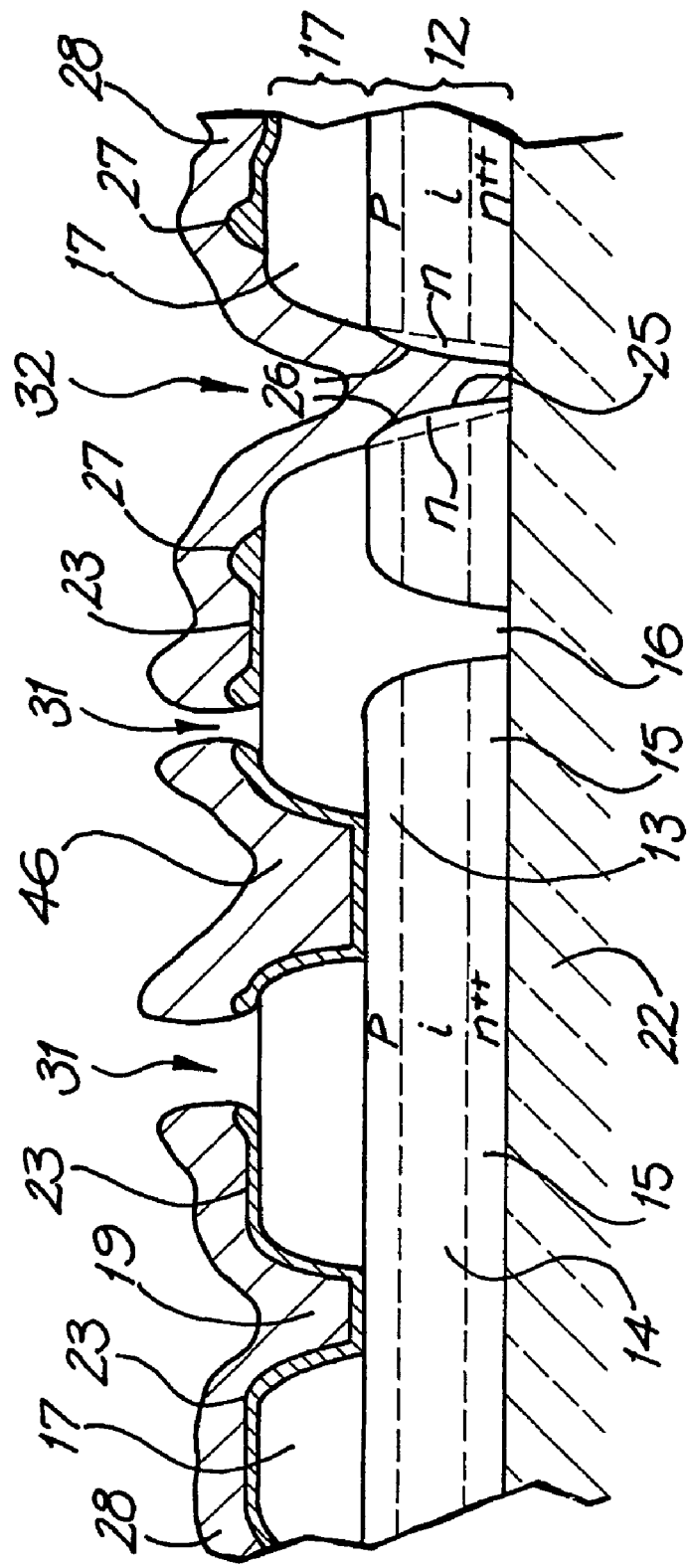
FIG. 10 is a sectional view through the second embodiment of the semiconductor device as shown in FIG. 9 after the metallisation has been interrupted by the scribing process.

A portion of the completed structure is illustrated in FIG. 10 which shows the connection of an n-type contact of one cell to the p-type contact of an adjacent cell to provide a series connections of cells. The section shown in FIG. 10 approximates the section that would be seen through section line 'XX-XX' shown in FIG. 9

Instead of providing a metal bridge connecting the p type metal contact pad of one cell to the n type contact pad of the adjacent cell as described above, the bridges 46 could simply be provided by periodically turning the laser off during the horizontal scribe leaving a residual part of the metal layers 23 and 28 defining the bridge.

It will be appreciated that using this embodiment since the n type metal pads and the p type metal pads are aligned, it is possible to make the n type metal pads and the p type metal pads of different widths to one another. The series resistance can be reduced by optimising the width separately.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A photovoltaic device comprising a plurality of interconnected photovoltaic cells, each cell comprising a first semiconductor layer underlying a second semiconductor layer and an insulation layer which overlays the second semiconductor layer, the first and second semiconductor layers being of different dopant polarity types and forming a photovoltaic junction, interconnections of the plurality of cells being made via a plurality of isolated connections, each said connection connecting a connection point in the first semiconductor layer in one cell to a connection point in the second semiconductor layer in an adjacent cell of the device, the insulation layer being formed over the plurality of interconnected photovoltaic cells such that the interconnections are made through the insulation layer by a layer of metal material formed over the insulation layer such that the metal material is isolated from the photovoltaic cells by the insulation layer and the metal material being divided into a plurality of metal contacts, each metal contact of the plurality of metal contacts providing at least one of said isolated connections, to connect the cells of the device in series, the metal contacts extending transversely relative to cell boundaries which separate the cells, each metal contact being interrupted at or adjacent every second cell boundary and adjacent metal contacts being interrupted at alternate cell boundaries, connection paths to the first semiconductor layer being formed by the metal material extending through first holes in the insulation layer and the second semiconductor layer to contact the connection points in the first semiconductor layer and connection paths to the second semiconductor layer being formed by the metal material extending through second holes in the insulation layer to contact the connection points in the second semiconductor layer of each cell, wherein the first holes are smaller than the second holes.

2. The device of claim 1, wherein the first semiconductor layer is an n-type semiconductor layer which underlies the second semiconductor layer which is a p-type type semiconductor layer, and the connection paths to the first semiconductor layer comprise regions of the p-type semiconductor layer having altered characteristics in the vicinity of the corresponding connection points.

3. The device of claim 2, wherein the altered characteristics of the regions of the p-type semiconductor are created in conjunction with the formation of the layer of metal material.

4. The device as claimed in claim 1, wherein the photovoltaic device includes polycrystalline thin film silicon solar cells comprising a textured glass substrate over which is formed an anti-reflection coating and a film of silicon comprising the first and second semiconductor layers forming the photovoltaic junction which is in a plane parallel to the surface of the film.

5. The device of claim 1, wherein the insulation layer comprises a single layer of organic resin insulating material.

6. The device of claim 1, wherein the insulation layer comprises a plurality of layers including a thin passivation layer and a thicker layer of a different dielectric material.

7. The device of claim 6, wherein the passivation layer comprises a layer of silicon nitride or silicon oxide.

8. The device of claim 7, wherein the passivation layer is in the range of 50 to 200 nm thick.

9. The device of claim 8, wherein the passivation layer is in the range of 90-110 nm thick.

10. The device of claim 9, wherein the thicker dielectric layer is a layer of organic resin.

11. The device of claim 10, wherein the thicker dielectric layer is a layer of novolac resin.

12. The device of claim 11, wherein the thicker dielectric layer has a thickness of 2-5 µm.

13. The device of claim 11, wherein the thicker dielectric layer has a thickness of 3-4 µm.

14. The device of claim 1, wherein the second holes have diameters in the range of 50-500 µm.

15. The device of claim 1 wherein the second holes have diameters in the range of 140-160 µm.

16. The device of claim 1, wherein the first holes have diameters in the range of 25-100 µm.

17. The device of claim 1, wherein the first holes have diameters in the range of 35-44 µm.

18. The device of claim 1, wherein the first and second holes are substantially circular.

19. The device of claim 1, wherein the first and second holes are elongate in shape.

20. The device of claim 1, wherein the first holes are spaced apart to prevent isolation of parts of the cell area.

21. The device as claimed in claim 1, wherein the plurality of metal contacts are separated by a scribe width in the range of 100-200 µm.

22. The device of claim 21, wherein the scribe width is in the range of 140-160 µm.

23. The device as claimed in claim 1, wherein the layer of metal material comprises a single layer of metal.

24. The device of claim 23, wherein the layer of metal material comprises a layer of aluminum.

25. The device of claim 1, wherein the layer of metal material comprises a plurality of layers of different metals.

26. The device of claim 25, wherein the layer of metal material comprises a thin metal layer of nickel, silver or copper.

27. The device of claim 26, wherein the thin metal layer has a thickness in the range of 5-20 nm.

28. The device of claim 26, wherein the thin metal layer has a thickness of 9-11 nm.

29. The device of claim 28, wherein the layer of metal material comprises an aluminum layer formed over the thin metal layer.

30. The device of claim 24, wherein the aluminum layer has a thickness in the range of 50-150 nm.

31. The device of claim 24, wherein the aluminum layer has a thickness of 90-110 nm.

32. The device of claim 29, wherein the aluminium layer has a thickness in the range of 50-150 nm.

33. The device of claim 29, wherein the aluminium layer has a thickness of 90-110 nm.

* * * * *